(12) United States Patent
Kimura

(10) Patent No.: US 7,511,301 B2
(45) Date of Patent: Mar. 31, 2009

(54) LIQUID CRYSTAL DISPLAY UNIT

(75) Inventor: Shigeru Kimura, Kanagawa (JP)

(73) Assignee: NEC LCD Technologies, Ltd., Kanagawa (JP)

( * ) Notice: Subject to any disclaimer, the term of this patent is extended or adjusted under 35 U.S.C. 154(b) by 484 days.

(21) Appl. No.: 11/000,153

(22) Filed: Dec. 1, 2004

(65) Prior Publication Data

US 2005/0161670 A1 Jul. 28, 2005

(30) Foreign Application Priority Data

Dec. 1, 2003 (JP) .............................. 2003/401964

(51) Int. Cl.
*H01L 27/00* (2006.01)
(52) U.S. Cl. ............................ 257/72; 257/59; 257/258; 257/E27.119
(58) Field of Classification Search .................. 257/59, 257/72, 258, E27.119; 438/34, 66
See application file for complete search history.

(56) References Cited

U.S. PATENT DOCUMENTS

| | | | |
|---|---|---|---|
| 6,559,913 B1 * | 5/2003 | Sera | 349/111 |
| 6,583,829 B2 * | 6/2003 | Ootsu et al. | 349/43 |
| 6,953,949 B2 * | 10/2005 | Murade | 257/59 |
| 7,050,137 B2 * | 5/2006 | Hoshino et al. | 349/149 |
| 2001/0029071 A1 * | 10/2001 | Zhang et al. | 438/151 |
| 2004/0124418 A1 * | 7/2004 | Yamazaki et al. | 257/72 |
| 2005/0173703 A1 * | 8/2005 | Lebrun | 257/59 |
| 2006/0049407 A1 * | 3/2006 | Jung et al. | 257/72 |

FOREIGN PATENT DOCUMENTS

| | | | | |
|---|---|---|---|---|
| JP | 60-236266 | 11/1985 | | |
| JP | 4-360534 | 12/1992 | | |
| JP | 5-224234 | 9/1993 | | |
| JP | 5-259300 | 10/1993 | | |
| JP | 08-330592 | * 5/1995 | | 29/786 |
| JP | 8-330592 | 12/1996 | | |
| JP | 10-78591 | 3/1998 | | |
| JP | 11-84421 | * 3/1999 | | |
| JP | 2001-117116 | 4/2001 | | |
| JP | 5-302654 | 10/2003 | | |

* cited by examiner

*Primary Examiner*—Victor A Mandala
(74) *Attorney, Agent, or Firm*—Young & Thompson

(57) ABSTRACT

To provide an active matrix liquid crystal display unit in which a wiring break at the intersection of drain wiring and gate wiring is prevented with reliability. One or more recesses extending along drain wiring and having a depth equal to or greater than the width of the drain wiring are formed in at least one side of gate wiring at an area near an intersection of the gate wiring and the drain wiring. Furthermore, the gate wiring is composed of two layers of Mo and Al, for example, and the side faces of the gate wiring are tapered. The recesses having a sufficient depth formed in the gate wiring at the area near the intersection with the drain wiring adequately elongate the etchant penetration path.

19 Claims, 15 Drawing Sheets

LIQUID CRYSTAL DISPLAY UNIT

BACKGROUND OF THE INVENTION

1. Field of the Invention

The present invention relates to a liquid crystal display unit. In particular, it relates to an active matrix liquid crystal display unit.

2. Description of the Related Art

An active matrix liquid crystal display unit using a thin film transistor (abbreviated as TFT, hereinafter) as a switching element is widely used. Such an active matrix liquid crystal display unit comprises: a substrate on which gate wiring, drain wiring, TFTs, pixel electrodes and the like are disposed (referred to as a TFT substrate, hereinafter); an opposite substrate on which a color filter, a black matrix and the like are disposed; and a liquid crystal interposed between the substrates. Applying a voltage between the electrodes on the TFT substrate and the electrodes on the opposite substrate or between plural electrodes on the TFT substrate causes the orientations of the liquid crystal molecules, thereby controlling the light transmission on a pixel-to-pixel basis.

FIGS. 1, 2A and 2B show an exemplary structure of an active matrix liquid crystal display unit disclosed in Japanese Patent Laid-Open No. 8-330592. FIG. 1 is a plan view of a TFT substrate showing a configuration thereof near an intersection of gate wiring and drain wiring. FIGS. 2A and 2B are cross-sectional views thereof taken along the lines I-I and II-II in FIG. 1, respectively.

As shown in FIGS. 1, 2A and 2B, the TFT substrate comprises a transparent insulating substrate 1, gate wiring 2 on the transparent insulating substrate 1, and drain wiring 6 that perpendicularly intersects with the gate wiring 2 with a gate insulating film 3 interposed therebetween. At the intersection of the gate wiring 2 and the drain wiring 6, an island-like semiconductor layer is provided on the gate insulating film 3. The semiconductor layer comprises a lower amorphous silicon sublayer (referred to as an a-Si sublayer 4, hereinafter) and an upper n$^+$a-Si sublayer 5 containing an n-type impurity in a relatively large amount. A TFT 11 is disposed near the intersection of the gate wiring 2 and the drain wiring 6. The TFT 11 comprises a gate electrode 2A, the gate insulating film 3, the a-Si sublayer 4, the n$^+$a-Si sublayer 5, a drain electrode 6A and a source electrode 7. A channel section of the TFT 11 is formed by partially removing the n$^+$a-Si sublayer 5 and the a-Si sublayer 4. The drain electrode 6A and the source electrode 7 are located on the opposite sides of the channel section. The drain electrode 6A and the gate electrode 2A of the TFT 11 are connected to the drain wiring 6 and the gate wiring 2, respectively. A pixel electrode 9, which is made of a transparent conductive film of indium tin oxide (ITO) or the like, is formed so as to partially overlap with the source electrode 7, and a passivation layer 8 for protecting the surface of the substrate is formed on the pixel electrode 9 and the source electrode 7.

In this way, in order to drive a matrix array of the TFTs 11, the TFT substrate has the gate wiring 2 and the drain wiring 6 disposed perpendicular to each other. If the TFT substrate has inverted-staggered TFTs 11, the drain wiring 6 is formed over the gate wiring 2. The drain wiring 6 is formed by depositing a metal material, such as Cr, by sputtering or the like. It is known that the Cr film deposited by sputtering is not dense and, in particular, is coarse in an area covering a step. Furthermore, sputtering cannot provide adequate step coverage, and thus, the resulting metal film, which is to constitute the drain wiring 6, is thinner on the side faces of the step on the gate insulating film 3 formed due to the gate wiring 2. Therefore, when the deposited metal film, which is to constitute the drain wiring 6, is wet-etched using a resist pattern as a mask, the etching process is completed faster in the side faces of the step, and the etchant penetrates into the interface between the gate insulating film 3 and the metal film at the step. As a result, a problem occurs that the drain wiring 6 is broken.

The Japanese Patent Laid-Open No. 8-330592 described above discloses a method of avoiding such defective etching of the upper wiring due to the step at the intersection of wires. According to the Japanese Patent Laid-Open No. 8-330592, as shown in FIG. 3, the gate wiring 2 (gate electrode 2A) and the semiconductor layers located below the drain wiring 6, the drain electrode 6A and the source electrode 7 have protrusions formed at the opposite sides thereof. It is described that the penetration path for the etchant is elongated by these protrusions, and thus, the drain wiring 6 can be prevented from being broken at the step formed due to the underlying gate wiring 2 and semiconductor layers.

In the liquid crystal display unit, the gate wiring and the drain wiring tend to be made thin to improve the aperture ratio. As the drain wiring becomes thinner, the penetration path for the etchant becomes shorter, and the wire becomes more likely to be broken. Besides, to reduce the parasitic capacitance between the gate wiring and the drain wiring, it is preferred that the gate wiring is as thin as possible at the intersection. However, in the Japanese Patent Laid-Open No. 8-330592 described above, no mention is made of the size of the protrusions. The protrusions formed on the gate wiring 2 described in the Japanese Patent Laid-Open No. 8-330592 cannot provide sufficient extension of the penetration path for the etchant. In addition, since the protrusions extending outwardly from the gate wiring 2 are formed along the drain wiring 6, the parasitic capacitance between the wires increases.

Furthermore, in the Japanese Patent Laid-Open No. 8-330592 described above, as can be seen from FIG. 3, the gate wiring 2 has substantially right-angled side faces, which are reflected in the drain wiring 6, and thus, the drain wiring 6 has a step having substantially right-angled side faces. The drain wiring 6 is composed of a metal film, specifically, a Cr film. At the side faces of the step, the metal film is covered inadequately, so that the metal film is thinner than in the remaining areas, and thus, the metal film is susceptible to penetration of the etchant. Thus, even if the protrusions are formed on the gate wiring 2 to elongate the penetration path for the etchant, it is difficult to prevent the drain wiring 6 from being broken with reliability.

As described above, if the drain wiring is thin to improve the definition of the liquid crystal display unit, it is necessary to optimize not only the two-dimensional configuration of the gate wiring at the intersection of the gate wiring and the drain wiring but also the three-dimensional configuration thereof in accordance with the width of the drain wiring.

SUMMARY OF THE INVENTION

The present invention has been devised in view of such circumstances, and a primary object of the present invention is to provide an active matrix liquid crystal display unit in which a break of wiring at the intersection of lower wiring (gate wiring) and upper wiring (drain wiring) is prevented with reliability.

A liquid crystal display unit according to the present invention has a TFT substrate, the TFT substrate comprises a transparent insulating substrate and lower first wiring and upper second wiring disposed on the transparent insulating substrate and perpendicularly intersecting with each other, and a thin film transistor is formed in each area surrounded by the first wiring and the second wiring. On the TFT substrate, one or more recesses extending along the second wiring are formed in at least one side of the first wiring at an area near an intersection with the second wiring.

In addition, a liquid crystal display unit according to the present invention has a TFT substrate, the TFT substrate comprises a transparent insulating substrate and lower first wiring and upper second wiring disposed on the transparent insulating substrate and perpendicularly intersecting with each other, and a thin film transistor is formed in each area surrounded by the first wiring and the second wiring. On the TFT substrate, one or more recesses extending along the second wiring and having a depth equal to or greater than the width of the second wiring are formed in at least one side of the first wiring at an area near an intersection with the second wiring.

In the liquid crystal display unit according to the present invention described above, two or more sides, extending along the second wiring, of the recesses formed in each side of the first wiring at the area near the intersection with the second wiring may be located within the area directly below the second wiring. Furthermore, two recesses may be formed in each side of the first wiring at the area near the intersection with the second wiring, and adjacent sides of the two recesses extending along the second wiring may be located within the area directly below the second wiring.

In addition, in the liquid crystal display unit according to the present invention described above, it is preferred that the first wiring on the TFT substrate is composed of a stack of plural kinds of metals, and side faces of the first wiring are tapered at a predetermined inclination angle. The metal stack is composed of a lower layer of Al or an Al alloy and an upper layer of Mo or a Mo alloy. The taper angle of the side faces of the first wiring preferably falls between 30 degrees and 80 degrees.

In this way, in the liquid crystal display unit according to the present invention, the recesses formed in the first wiring (gate wiring) on the TFT substrate adequately elongate the etchant penetration path, and thus, even if the width of the drain wiring is small, a break of the drain wiring can be prevented with reliability. In addition, since the gate wiring is composed of two layers of Mo and Al, and the side faces of the gate wiring are tapered, the step on the drain wiring can be made less steep, and deterioration in quality and reduction in thickness of the drain wiring at the step can be suppressed. As a result, the etchant penetration is hard to occur, and thus, a break of the drain wiring can be prevented with higher reliability.

BRIEF DESCRIPTION OF THE DRAWINGS

The above and other objects, features and advantages of the present invention will become more apparent from the following detailed description when taken in conjunction with the accompanying drawings wherein.

DETAILED DESCRIPTION OF THE PREFERRED EMBODIMENTS

As a liquid crystal display unit according a preferred embodiment of the present invention, an active matrix liquid crystal display unit will be described. In the liquid crystal display unit according to the present invention, gate wiring on the TFT substrate has one or more recesses extending along drain wiring formed in at least one side thereof at an area near an intersection with the drain wiring. The recesses have a depth equal to or greater than the width of the drain wiring. Furthermore, the gate wiring is composed of two layers, the lower one of which is of Al or an Al alloy, and the upper one of which is of Mo or a Mo alloy. To optimize the two-dimensional configuration and the three-dimensional configuration of the gate wiring, the side faces of the gate wiring are tapered. In the liquid crystal display unit according to the present invention, the recesses having a sufficient depth formed in the side(s) of the gate wiring at the area near the intersection with the drain wiring adequately elongate the etchant penetration path. In addition, since the side faces of the gate wiring are tapered, the step formed on the drain wiring at the intersection with the gate wiring can be made less steep, and deterioration in quality and reduction in thickness of the drain wiring at the intersection can be suppressed. As a result, a break of the drain wiring at the intersection with the gate wiring can be prevented with higher reliability. In the following, liquid crystal display units according to embodiments of the present invention will be described in detail.

First Embodiment

An active matrix liquid crystal display unit according to a first embodiment will be described with reference to the drawings.

Figure 4:
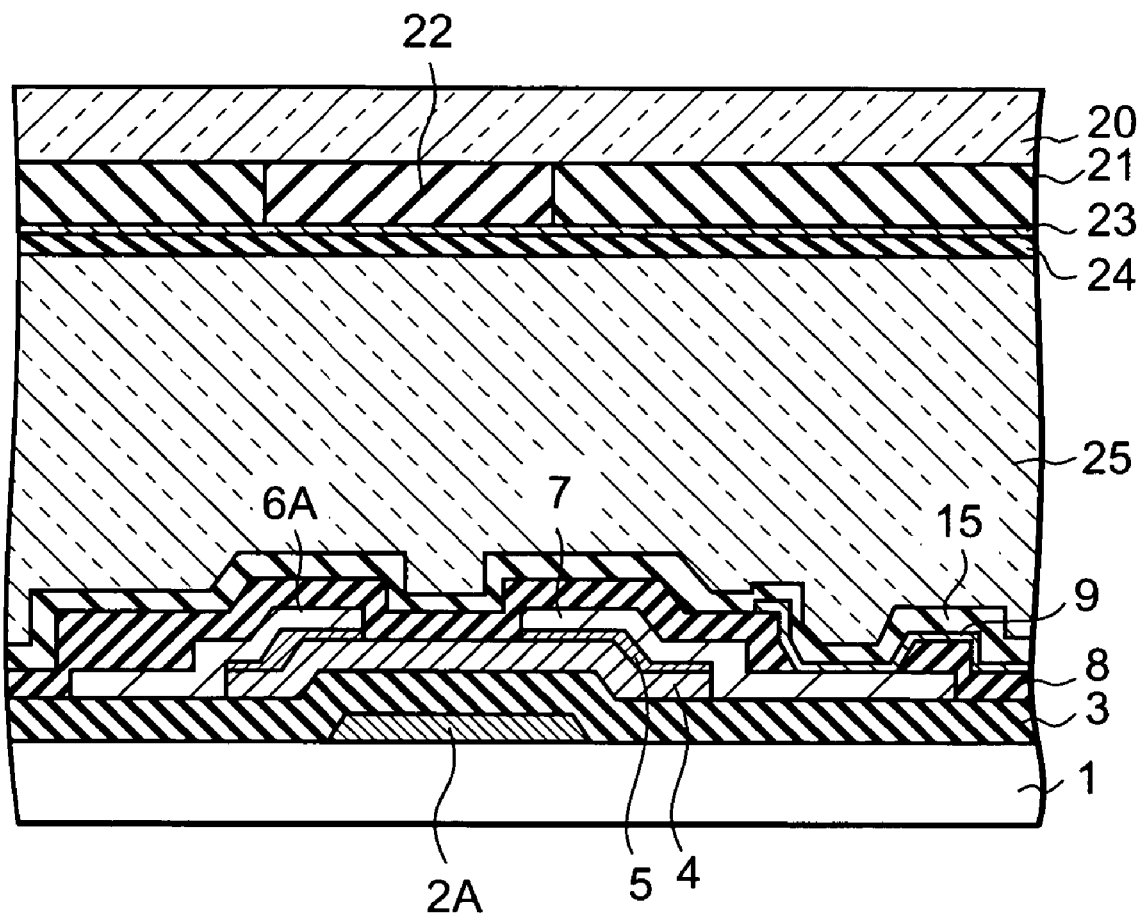
FIG. 4 is a cross sectional view of a liquid crystal display unit according to a first embodiment of the present invention.

FIG. 4 is across sectional view of the liquid crystal display unit according to the first embodiment of the present invention.

Referring to FIG. 4, the liquid crystal display unit according to the first embodiment has a transparent insulating substrate 1, a gate electrode 2A and gate wiring (not shown) formed on the transparent insulating substrate, and a gate insulating film 3 made of silicon nitride formed on the transparent insulating substrate 1 and the gate electrode 2A. The gate electrode 2A and the gate wiring are composed of two layers, one of which is made of Al or an Al alloy, and the other of which is made of Mo or a Mo alloy. On the gate insulating film 3, an island-like semiconductor layer comprising an a-Si sublayer 4 and an n⁺a-Si sublayer 5. Parts of the n⁺a-Si sublayer 5 and the a-Si sublayer 4 of the semiconductor layer of a TFT above the gate electrode 2A are removed to form a channel section. A drain electrode 6A and a source electrode 7 are formed on the semiconductor layer on the opposite sides of the channel section. Although not shown, the drain electrode 6A is connected to drain wiring, which is formed on the gate insulating film concurrently with the drain electrode 6A. The drain electrode 6A, the drain wiring and the source electrode 7 are made of a metal film of Cr or the like. The gate electrode 2A, the gate insulating film 3, the semiconductor layer comprising the a-Si sublayer 4 and the n⁺a-Si sublayer 5, the drain electrode 6A and the source electrode 7 constitute the TFT. The TFT shown in FIG. 4 is an inverted-staggered one. On the TFT, a passivation film 8 made of silicon nitride or the like is disposed. On the passivation film 8, a pixel electrode 9 made of an ITO film or the like is formed. The pixel electrode 9 is connected to the source electrode 7 via a contact hole in the passivation film 8. Furthermore, an alignment layer 15 made of polyimide or the like is disposed on the passivation film 8 including the pixel electrode 9, and in this way, a TFT substrate is formed.

An opposite substrate is disposed so as to face the TFT substrate. The opposite substrate comprises a transparent insulating substrate 20, color filters 21 for R, G and B colors formed on the transparent insulating substrate 20, and a transparent electrode 23 made of an ITO film. On the opposite substrate, a black matrix 22 is formed at an area corresponding to the TFT and the wiring on the TFT substrate, and an alignment layer 24 is formed on the transparent electrode 23.

In addition, a liquid crystal layer 25 is inserted between the TFT substrate and the opposite substrate. In this way, the liquid crystal display unit according to the first embodiment of the present invention is formed.

Figure 5:
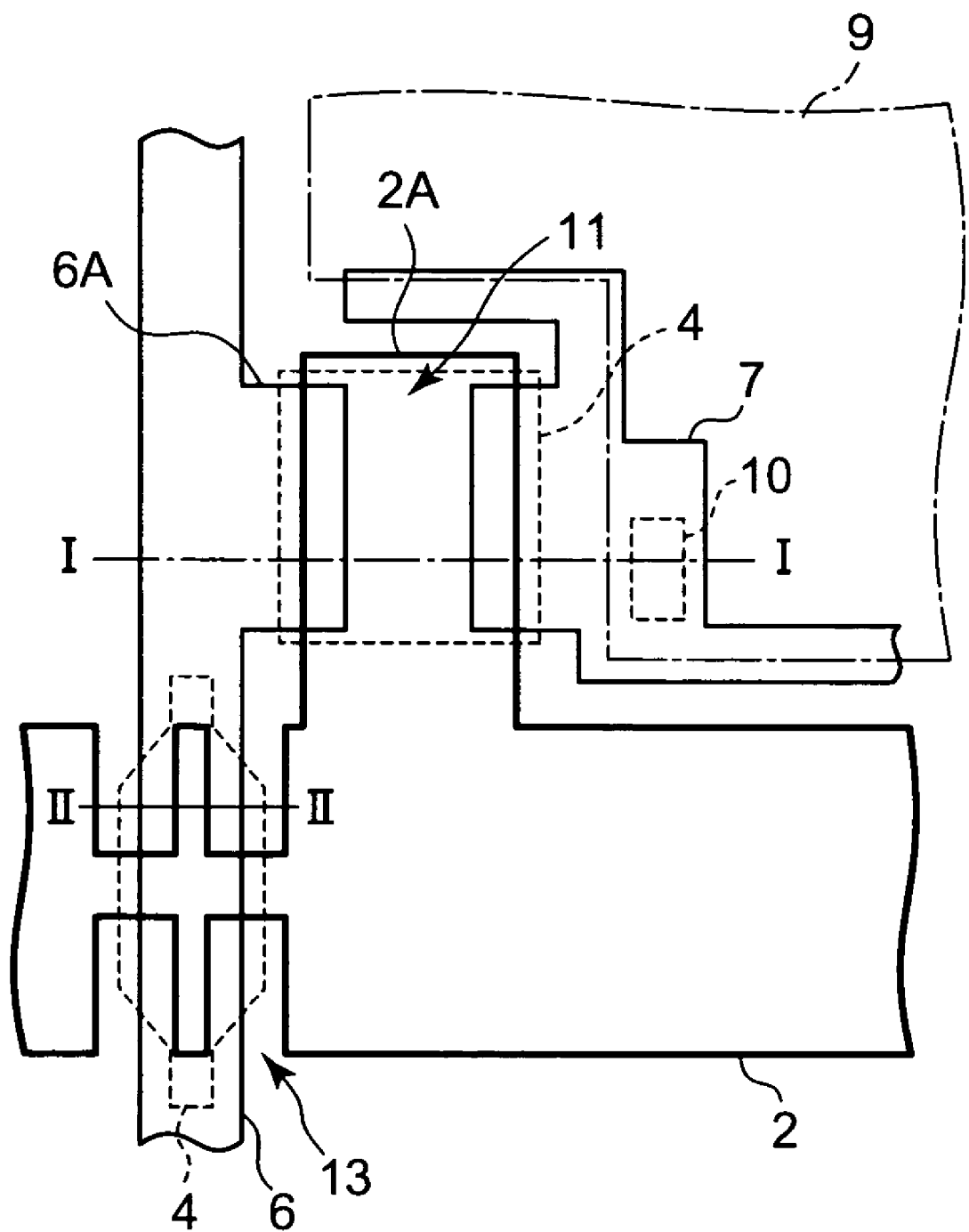
FIG. 5 is a plan view of a TFT substrate of the liquid crystal display unit according to the first embodiment of the present invention showing a configuration thereof near an intersection of gate wiring and drain wiring.
Figure 6A:
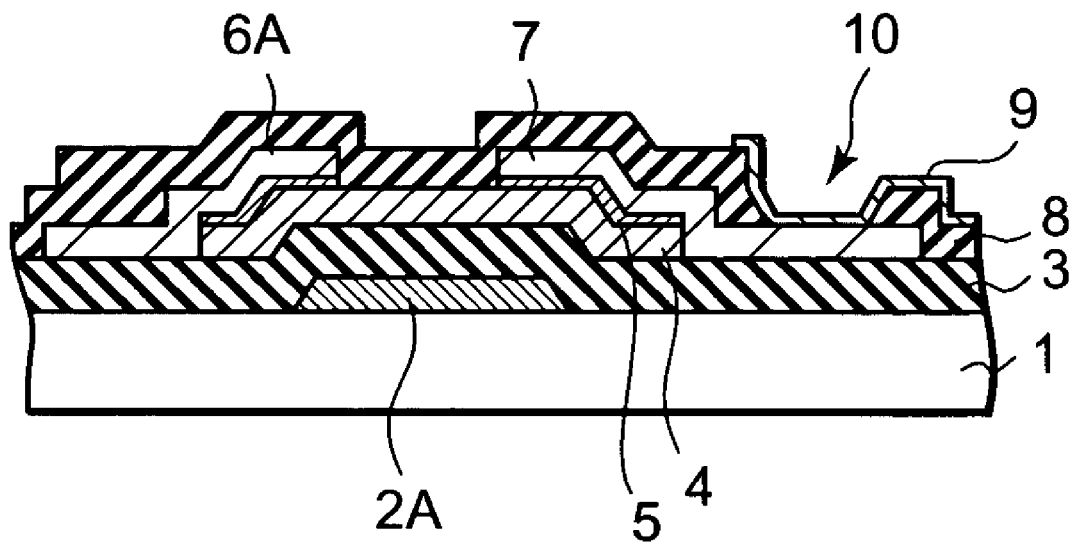
FIG. 6A is a cross-sectional view taken along the line I-I in FIG. 5.
Figure 6B:
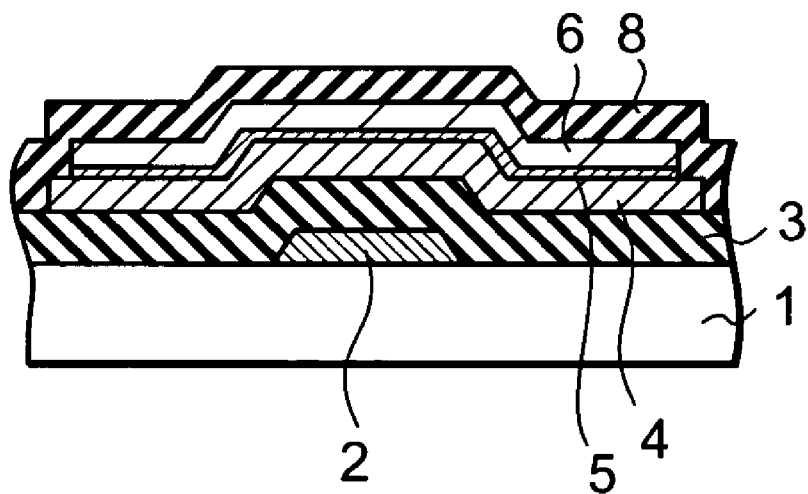
FIG. 6B is a cross-sectional view taken along the line II-II in FIG. 5.

FIG. 5 is a plan view of the TFT substrate of the liquid crystal display unit according to the first embodiment of the present invention showing a configuration thereof near an intersection of the gate wiring and the drain wiring. FIG. 6A is a cross-sectional view taken along the line I-I in FIG. 5, and FIG. 6B is a cross-sectional view taken along the line II-II in FIG. 5. FIGS. 7A to 7E are cross-sectional views for illustrating steps of a method of fabricating the TFT substrate, and FIGS. 8 to 12 are plan views showing various configurations of the gate wiring according to this embodiment.

First, a configuration of the TFT substrate of the active matrix liquid crystal display unit will be described with reference to FIGS. 5, 6A and 6B. On the transparent insulating substrate 1, the gate wiring 2 has one or more recesses 13 in a predetermined shape formed in at least one side thereof at an area near the intersection with the drain wiring 6.

Figure 1:
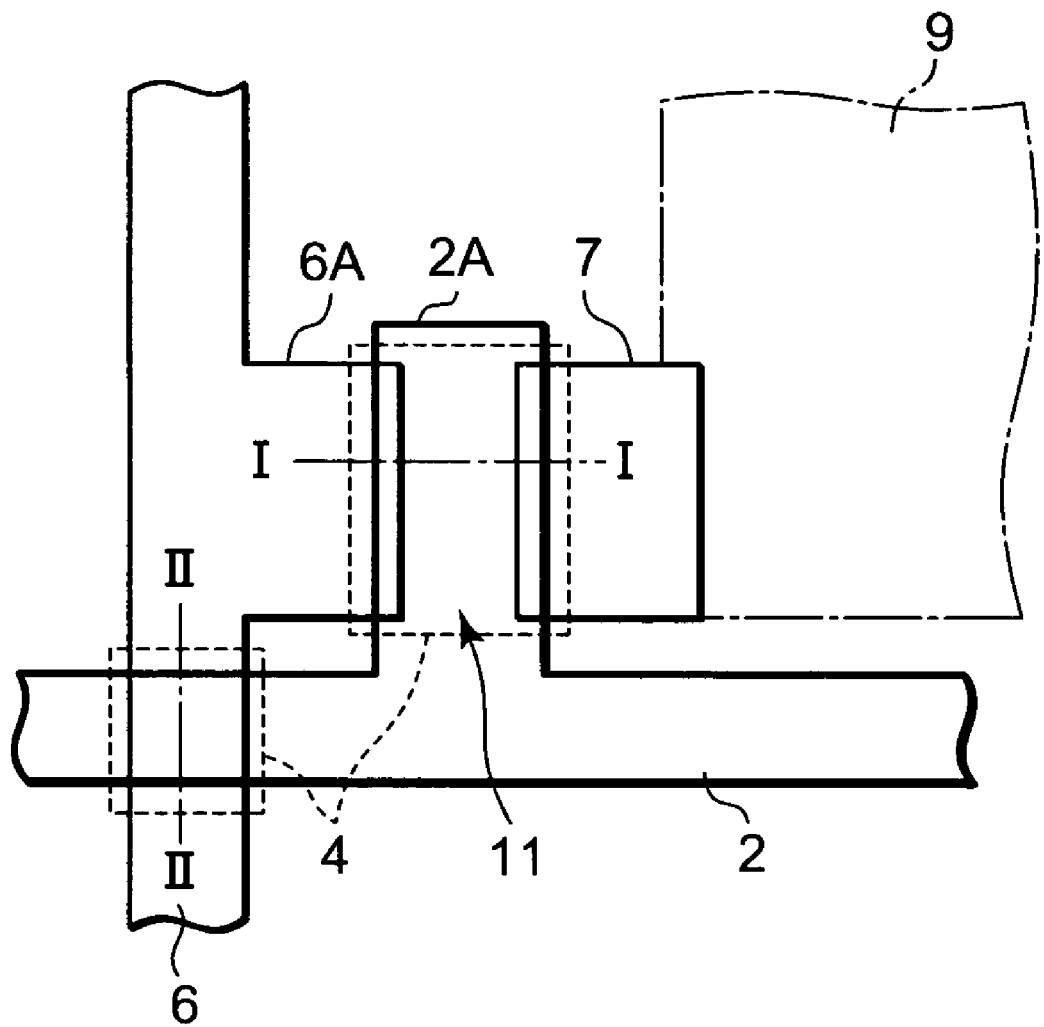
FIG. 1 is a plan view of a TFT substrate of a conventional liquid crystal display unit showing a configuration thereof near an intersection of gate wiring and drain wiring.
Figure 2A:
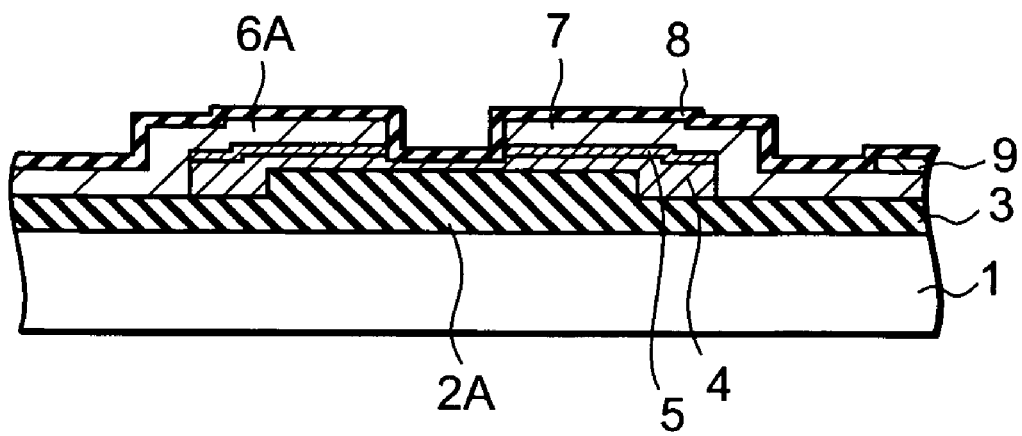
FIG. 2A is a cross-sectional view taken along the line I-I in FIG. 1.
Figure 2B:
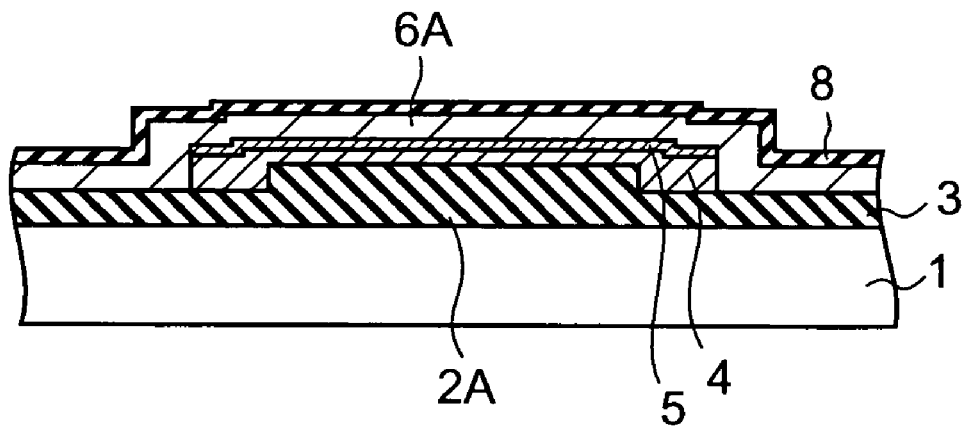
FIG. 2B is a cross-sectional view taken along the line II-II in FIG. 1.
Figure 3:
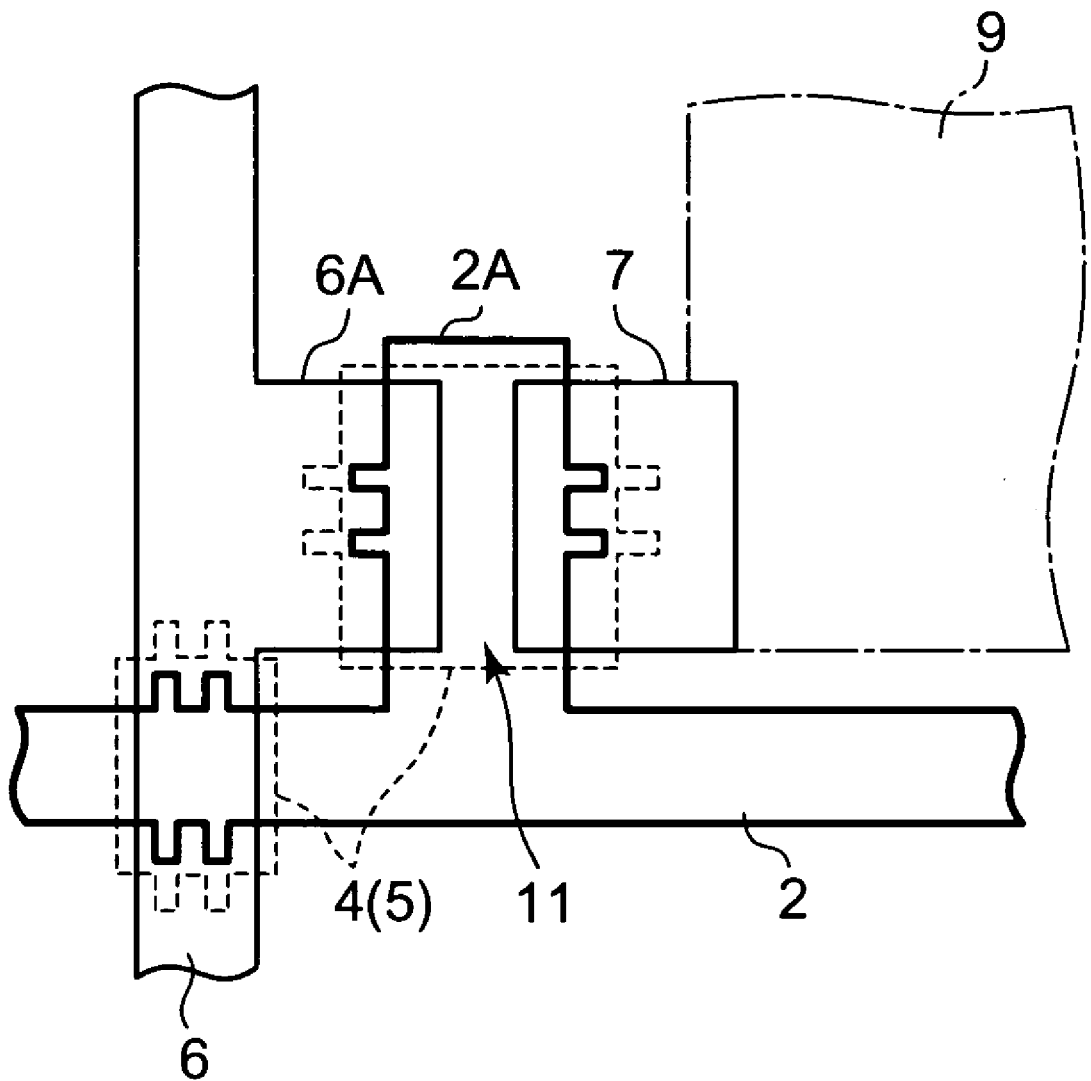
FIG. 3 is a plan view of a TFT substrate of a conventional liquid crystal display unit showing a configuration thereof near an intersection of gate wiring and drain wiring.

On the TFT substrate of the conventional liquid crystal display unit shown in FIG. 1, the drain wiring 6 has a step formed across the width due to the gate wiring 2. And, there is a problem that the etchant penetrates beneath the drain wiring 6 along the step to cause a break of the drain wiring 6. To avoid the problem, it is effective to elongate the penetration path for the etchant. In the Japanese Patent Laid-Open No. 8-330592, the gate wiring 2 has protrusions that are formed on the sides thereof at the intersections with the drain wiring 6 and extends along the drain wiring 6, thereby elongating the path for the etchant penetrating beneath the drain wiring 6 at the step on the gate wiring 2. However, when the width of the drain wiring 6 is thin, even if the gate wiring has protrusions at the intersection with the drain wiring, as described in the Japanese Patent Laid-Open No. 8-330592, it is difficult to secure a etchant penetration path having enough length to prevent a break of the drain wiring. In addition, such protrusions on the gate wiring increase the area of the gate wiring overlapping with the drain wiring, leading to an increased parasitic capacity.

Thus, according to this embodiment, one or more recesses 13 in a predetermined shape are formed in at least one side of the gate wiring 2 at an area near the intersection with the drain wiring 6 (in the drawing, two recesses are formed on each side). Viewed from the above, each recess 13 extends along the drain wiring 6 and has a depth equal to or greater than the width of the drain wiring. This shape of the recess 13 contributes to reduction of the parasitic capacity between the gate wiring 2 and the drain wiring 6 at the intersection thereof. In addition, the recesses 13 adequately elongate the etchant penetration path into the drain wiring which is formed at the step on the drain wiring formed above the gate wiring.

While a longer etchant penetration path is more advantageous, the recesses 13 cannot be so deep, taking into consideration the width of the gate wiring 2 or manufacturing or design restrictions. On the other hand, the inventor has confirmed that an etchant penetration path having a length about three times longer than the width of the drain wiring 6 can advantageously prevent a break of the drain wiring 6. Thus, according to the present invention, the depth of the recess 13 is equal to or greater than the width of the drain wiring, and the number and arrangement of the recesses are determined so that at least two sides of the recesses 13 extending along the drain wiring 6 are located beneath the drain wiring 6.

Furthermore, typical conventional TFT substrates use Cr, Ta or the like as a material of the gate wiring. However, depositing such metals by sputtering results in a structure of an array of minute metal columns (referred to as a columnar structure), and thus, if the deposited metal is wet-etched using an etchant, such as cerium ammonium nitrate, the side faces thereof resulting from etching are substantially vertical. The vertical side faces are reflected in the overlying drain wiring, so that the drain wiring becomes likely to be broken. Thus, according to this embodiment, the gate wiring 2 is composed of two layers, one of which is made of Al or an Al alloy, and the other of which is made of Mo or a Mo alloy, and the materials are etched using a mixed acid of phosphoric acid, nitric acid and acetic acid, thereby tapering the side faces of the gate wiring 2 at a predetermined inclination angle. Tapering the side faces of the gate wiring 2 makes the step on the drain wiring formed over the gate wiring 2 less steep, thereby suppressing a break of the drain wiring 6. The smaller the inclination angle of the tapered side faces (that is, the angle between the substrate plane and the side face of the gate wiring 2), the step on the drain wiring 6 becomes the less steep. On the other hand, the smaller the inclination angle, the more difficult it becomes to control the dimensions and shape of the gate wiring 2. Thus, in this embodiment, the inclination angle falls between 30 degrees to 80 degrees, and preferably, falls between 40 degrees to 50 degrees.

Figure 8:
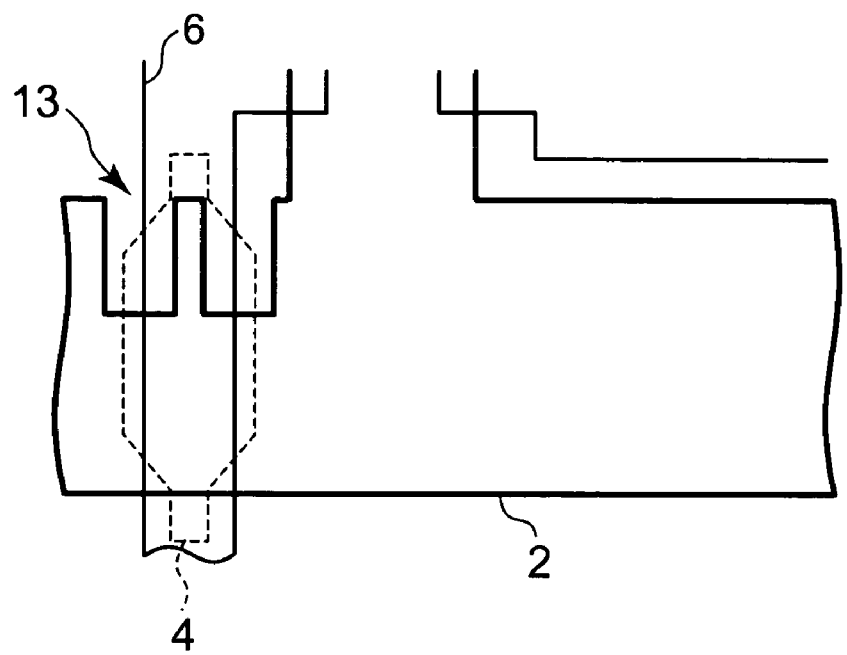
FIG. 8 is a plan view showing a variation of the configuration of the gate wiring according to the first embodiment of the present invention.
Figure 9:
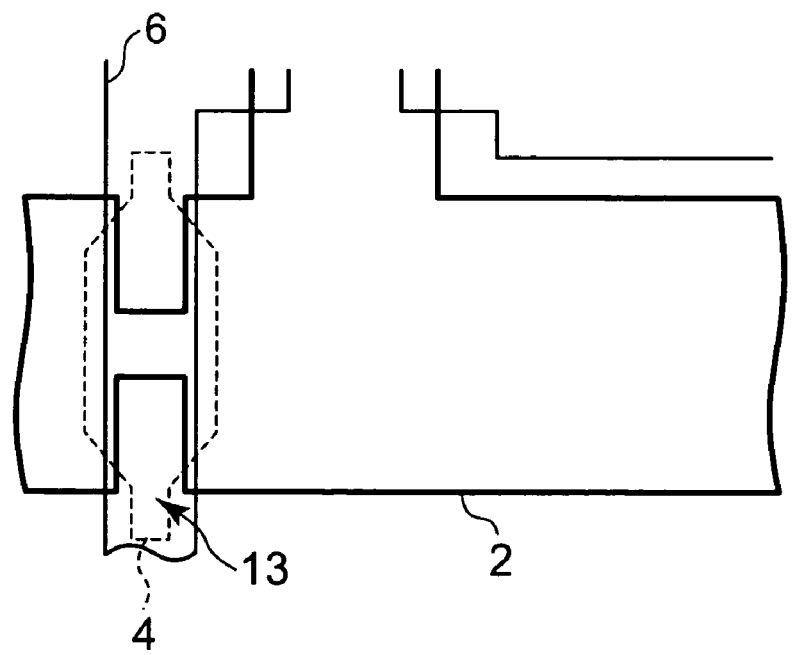
FIG. 9 is a plan view showing a variation of the configuration of the gate wiring according to the first embodiment of the present invention.
Figure 10:
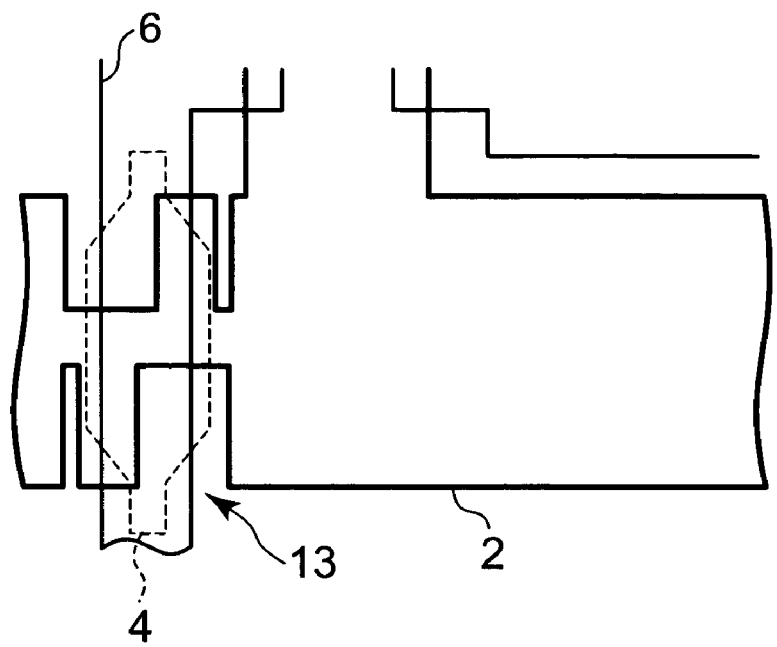
FIG. 10 is a plan view showing a variation of the configuration of the gate wiring according to the first embodiment of the present invention.
Figure 11:
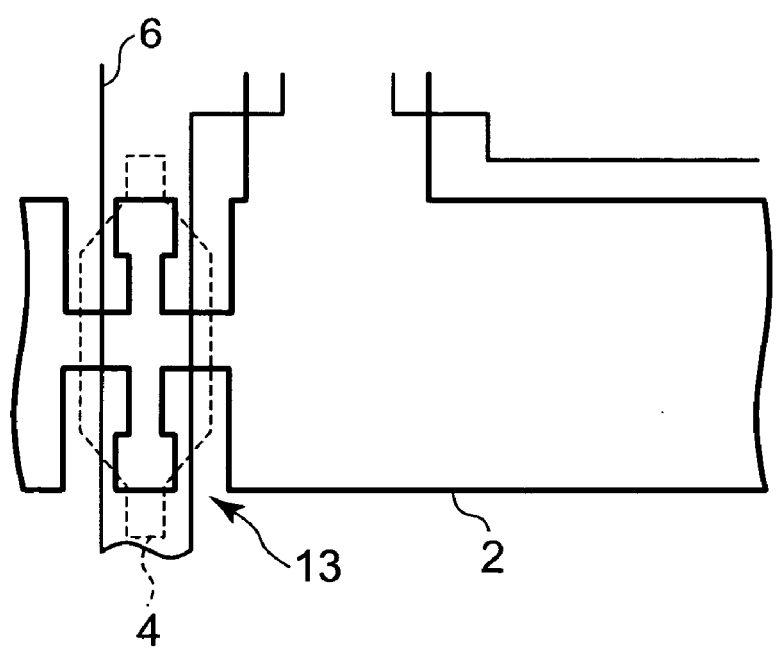
FIG. 11 is a plan view showing a variation of the configuration of the gate wiring according to the first embodiment of the present invention.
Figure 12:
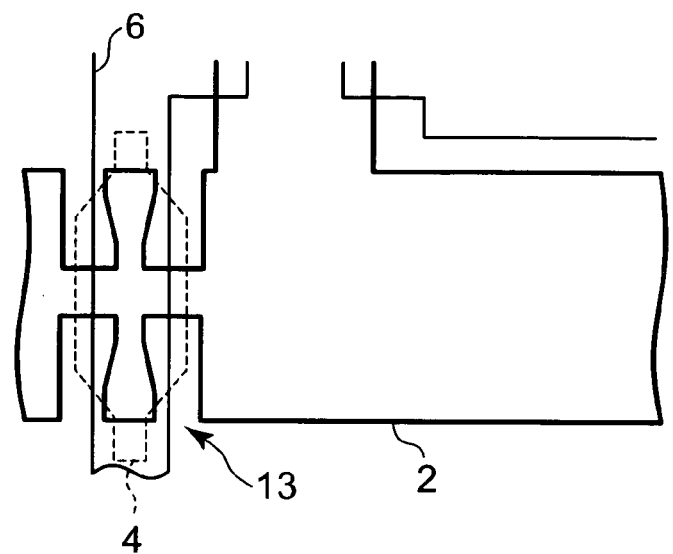
FIG. 12 is a plan view showing a variation of the configuration of the gate wiring according to the first embodiment of the present invention.

The shape of the recesses 13 of the gate wiring 2 shown in FIG. 5 is an example, and it is essential only that one or more recesses 13 having a depth equal to or greater than the width of the drain wiring 6 and extending along the drain wiring 6 are formed in at least one side of the gate wiring 2 at an area near the intersection with the drain wiring 6. FIG. 8 shows an example in which recesses 13 are formed only in one side of the gate wiring 2. FIG. 9 shows an example in which one recess 13 is formed in each side of the gate wiring 2. In the case where plural recesses 13 are formed, the recesses 13 do not necessarily have the same shape, and recesses 13 having different widths may be formed as shown in FIG. 10, or the recesses 13 formed on the opposite sides of the gate wiring 2 may have different shapes. Furthermore, the recess 13 or the protrusion between two recesses 13 may not be simply rectangular. For example, the protrusion may have a wider tip as shown in FIG. 11, a cross-shaped tip, or a tip formed by combination of lines parallel to the drain wiring 6, lines perpendicular to the same, and lines diagonal to the same as shown in FIG. 12.

In FIG. 5, the recesses 13 are formed only in the area near the intersection of the gate wiring 2 and the drain wiring 6, and the gate electrode 2A of the TFT section 11 is configured the same as conventional. A reason for this is that the drain electrode 6A and the source electrode 7 are wider than the drain wiring 6, and thus, a sufficiently long etchant penetration path can be provided even if no recess 13 is formed. Another reason is that a complicated configuration of the gate electrode 2A leads to local concentration of the electric field, which may affect the operation of the TFT 11. A similar recess 13 may be formed in the gate electrode 2A of the TFT 11.

The side faces of the gate wiring 2 and the gate electrode 2A are tapered at a predetermined inclination angle. At the intersection of the gate wiring 2 and the drain wiring 6 and the TFT area, the island-like semiconductor layer comprising the a-Si sublayer 4 and the n$^+$a-Si sublayer 5 is formed on the gate insulating film 3. In the TFT area, the n$^+$a-Si sublayer 5 and the a-Si sublayer 4 are partially removed to form the channel section. The drain electrode 6A and the source electrode 7 are located at the opposite sides of the channel section. The drain electrode 6A is connected to the drain wiring 6. The TFT is composed of the gate electrode 2A, the gate insulating film 3, the semiconductor layer, the source electrode 7 and the drain electrode 6A. On the TFT, the passivation film 8 for protecting the substrate surface is formed. The passivation film 8 on the source electrode 7 is partially removed to form a contact section 10. On the passivation film 8, the pixel electrode 9, which is made of a transparent conductive film of ITO or the like, is formed. The pixel electrode 9 is connected to the source electrode 7 via the contact section 10.

The present invention is characterized by the two-dimensional configuration and the three-dimensional configuration of the part of the gate wiring 2 intersecting with the drain wiring 6. The present invention is not subject to restrictions on the shapes, structures and manufacturing methods of components other than the gate wiring 2, including the gate insulating film 3, the semiconductor layer including the a-Si sublayer 4 and the n$^+$a-Si sublayer 5, the drain wiring 6, the passivation film 8, the pixel electrode 9, the opposite substrate and the liquid crystal. Furthermore, the present invention is characterized by the structure of the lower wiring of two kinds of wiring extending in different directions. In the case of a forward-staggered TFT in which the semiconductor layer is interposed between the upper gate wiring and the lower drain wiring, the structure of the gate wiring 2 described above is applied to the drain wiring.

Figure 7A:
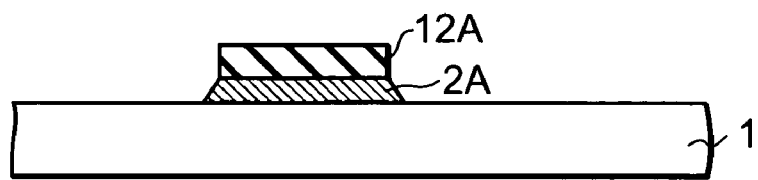
FIG. 7A is a cross-sectional view for schematically illustrating a step of a method of fabricating the TFT substrate of the liquid crystal display unit according to the first embodiment of the present invention.

Now, a method of fabricating the TFT substrate of the liquid crystal display unit according to the present invention will be described with reference to FIGS. 7A to 7E. First, as shown in FIG. 7A, by sputtering, for example, on the transparent insulating substrate 1 made of glass or the like, Al and Mo are successively deposited to about 200 nm and to about 100 nm, respectively, thereby forming a metal film to be the gate electrode and the gate wiring. Then, a first resist pattern 12A is formed on the metal film using a known lithography technique, and the first resist pattern 12A is used as a mask to perform wet etching to form the gate wiring 2 and the gate electrode 2A connected to the gate wiring 2. The etchant may be a mixed acid of phosphoric acid, nitric acid and acetic acid.

Figure 7B:
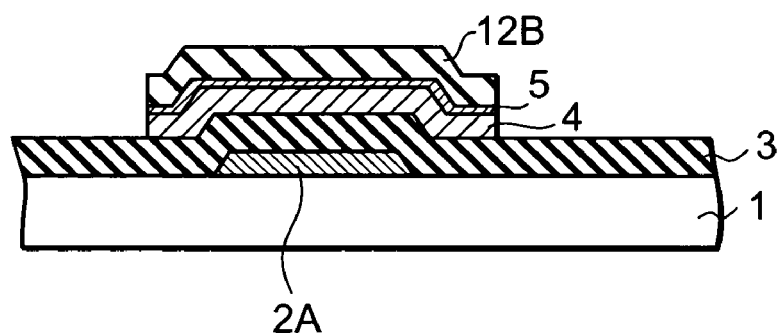
FIG. 7B is a cross-sectional view for schematically illustrating a step of the method of fabricating the TFT substrate of the liquid crystal display unit according to the first embodiment of the present invention.

Then, as shown in FIG. 7B, using plasma CVD, for example, the gate insulating film 3 made of silicon nitride is deposited to about 500 nm, and then, the a-Si sublayer 4 and the n$^+$a-Si sublayer 5, which constitute a semiconductor layer of the TFT 11, are deposited to about 300 nm and to about 50 nm, respectively. Then, a second resist pattern 12B is formed, and the second resist pattern 12B is used as a mask to perform dry etching to pattern the a-Si sublayer 4 and the n$^+$a-Si sublayer 5, thereby forming the island-like semiconductor layer.

Figure 7C:
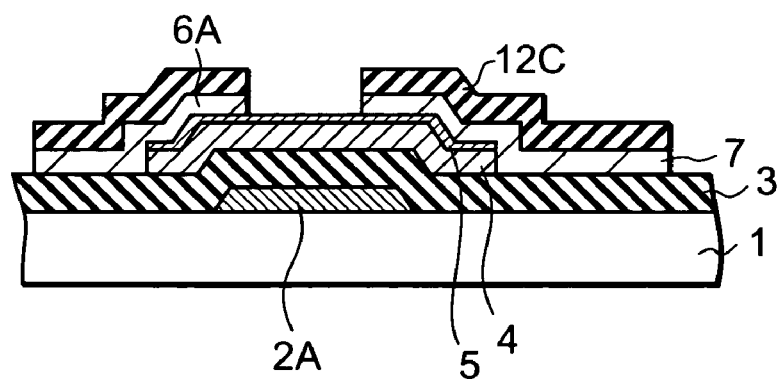
FIG. 7C is a cross-sectional view for schematically illustrating a step of the method of fabricating the TFT substrate of the liquid crystal display unit according to the first embodiment of the present invention.

Then, as shown in FIG. 7C, for example, by sputtering, Cr is deposited to about 200 nm. On the deposited Cr film, a third resist pattern 12C is formed, and the third resist pattern 12C is used as a mask to perform wet etching using an etchant, such as cerium ammonium nitrate, thereby forming the drain wiring 6, the drain electrode 6A and the source electrode 7.

Here, since the Cr film has the columnar structure as described above, and the columns are oriented differently particularly at a step, the Cr film wet-etched as described above is coarse. In the case where a metal is deposited by sputtering, the resulting metal film has a uniform thickness if the surface is planer. However, if there is a step on the surface, the metal deposited casts a shadow on the side faces of the step, and thus, the resulting film has a smaller thickness in the side faces of the step than in the planar area. Therefore, the etching process is completed faster in the side faces of the step, and there is a possibility that the etchant penetrates along the side faces of the step, causing a break of the drain wiring 6. However, according to this embodiment, the side faces of the gate wiring 2 are tapered to make the step on the drain wiring less steep. As a result, deterioration in quality and reduction in thickness of the drain wiring 6 are suppressed, and penetration of the etchant beneath the drain wiring 6 is also suppressed. In addition, since the gate wiring 2 has one or more recesses 13 in a predetermined shape, a sufficiently long etchant penetration path can be provided, and penetration of the etchant at a bend of the step can be suppressed. In this way, the drain wiring can be advantageously prevented from being broken.

Then, the n$^+$a-Si sublayer 5 and the a-Si sublayer 4 are partially removed by dry etching, for example, to expose the channel area between the drain wiring 6 and the source electrode 7.

Figure 7D:
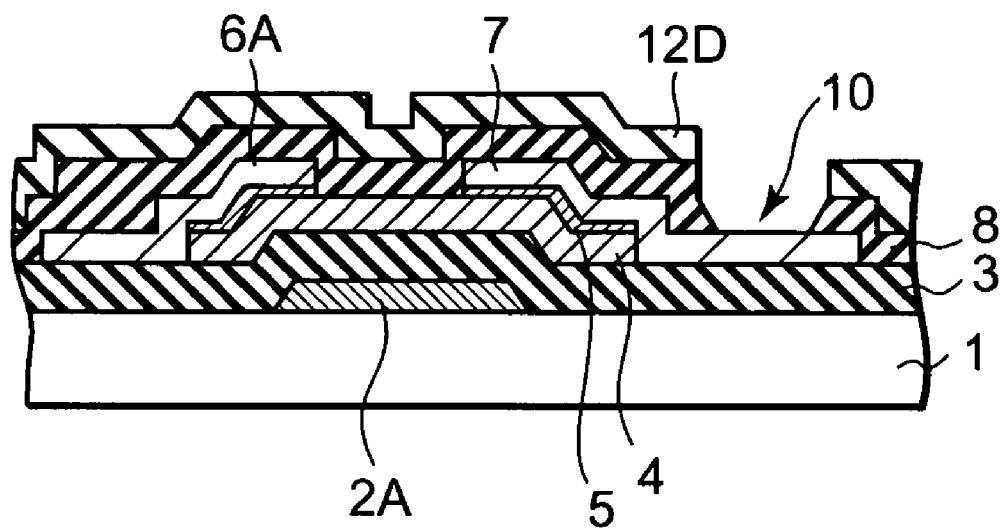
FIG. 7D is a cross-sectional view for schematically illustrating a step of the method of fabricating the TFT substrate of the liquid crystal display unit according to the first embodiment of the present invention.

Then, as shown in FIG. 7D, using plasma CVD, for example, the passivation film 8 made of silicon nitride is deposited to about 200 nm. Then, a fourth resist pattern 12$d$ is formed on the passivation film 8, and the fourth resist pattern 12$d$ is used as a mask to remove the passivation film 8 to form the contact section 10.

Figure 7E:
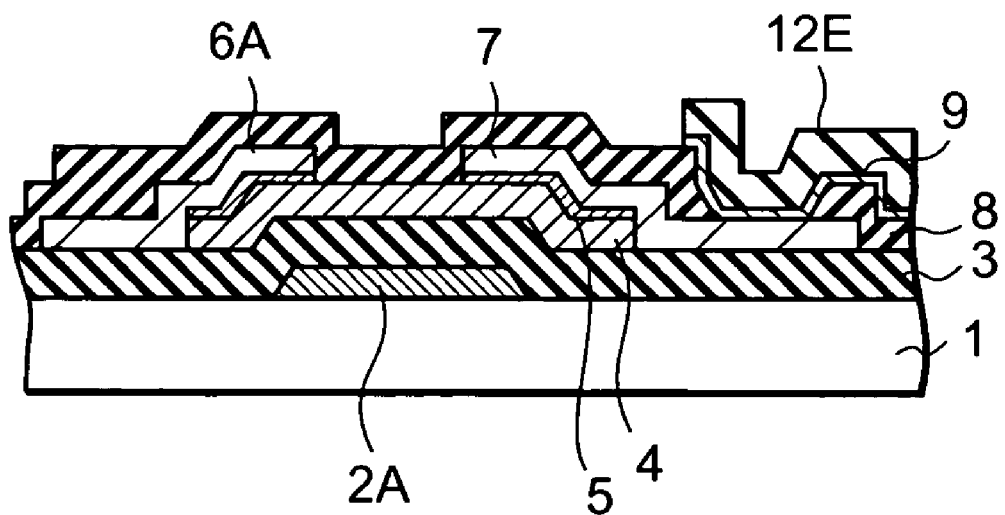
FIG. 7E is a cross-sectional view for schematically illustrating a step of the method of fabricating the TFT substrate of the liquid crystal display unit according to the first embodiment of the present invention.

Then, the resist pattern 12$d$ is removed, and then, as shown in FIG. 7E, the ITO film of a thickness of about 50 nm is formed by sputtering, for example, and the ITO film is wet-etched using a fifth resist pattern 12E as a mask, thereby forming the pixel electrode 9. The pixel electrode 9 is connected to the source electrode 7 via the contact section 10.

Then, the resist pattern 12E is removed, and then, an alignment processing for a predetermined direction is performed by applying an alignment layer over the whole surface, thereby completing the TFT substrate. The opposite substrate facing the TFT substrate is configured as shown in FIG. 4. On the transparent insulating substrate 20, the color filters 21 for the R, G and B colors associated with the pixels are formed, the black matrix 22 is formed at an area corresponding to the TFT and the wiring on the TFT substrate, and then, the transparent electrode 24 made of an ITO film is formed. On the transparent electrode, the alignment layer 24 is applied to complete the opposite substrate. The alignment layer 24 is subject to an alignment processing for a predetermined direction. Then, a spacer, which is constituted by inorganic particulates of a diameter from 4 to 5 μm, for example, is applied onto the opposite substrate, and then, the substrates are bonded together. The spacer provides a desired gap between the substrates, and a liquid crystal is injected into the gap. In this way, the active matrix liquid crystal display unit according to this embodiment is completed.

As described above, in the liquid crystal display unit according to this embodiment, when forming the gate wiring 2, one or more recesses 13 having a depth equal to or greater than the width of the drain wiring 6 and extending along the drain wiring 6 are formed in at least one side of the gate wiring 2 at an area near the intersection with the drain wiring 6. The recesses 13 formed on the gate wiring 2 adequately elongate the path for the etchant penetrating beneath the drain wiring 6 in the vicinity of the intersection of the drain wiring 6 and the gate wiring 2. Furthermore, the gate wiring is composed of two layers, the lower one of which is made of Al or an Al alloy, and the upper one of which is made of Mo or a Mo alloy, and the side faces of the gate wiring 2 are tapered at a predetermined inclination angle. Since the side faces of the gate wiring 2 are tapered, the step formed on the surface of the gate insulating film on the gate wiring 2 can be made less steep. As a result, deterioration in quality and reduction in thickness of the drain wiring 6 at the intersection with the gate wiring 2 can be suppressed, and the drain wiring can be prevented from being broken with reliability.

Second Embodiment

Figure 13:
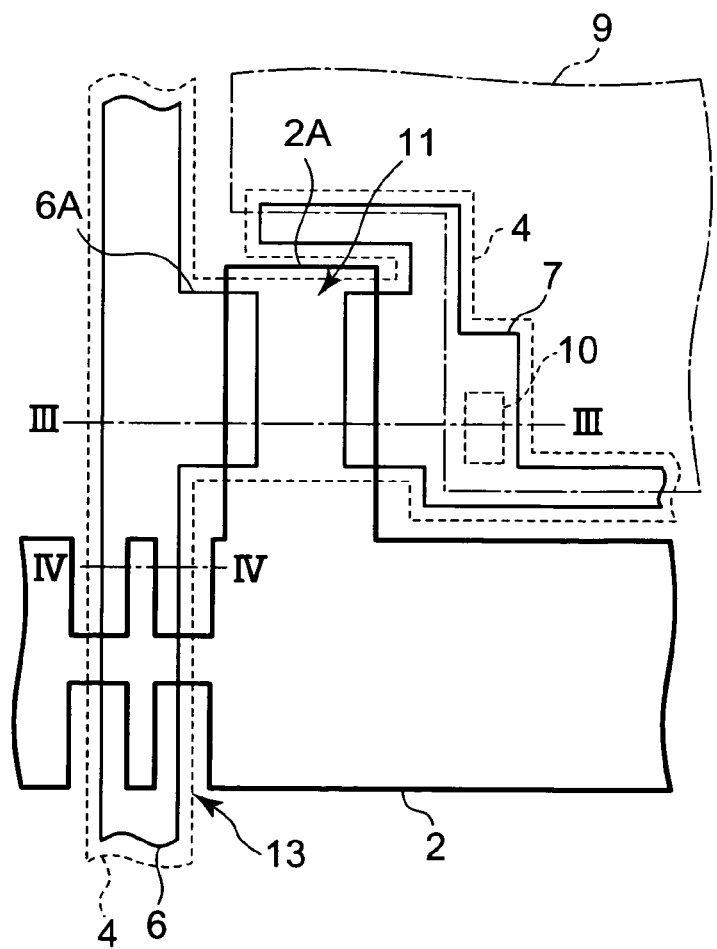
FIG. 13 is a plan view of a TFT substrate of a liquid crystal display unit according to a second embodiment of the present invention showing a configuration thereof near an intersection of gate wiring and drain wiring.
Figure 14A:
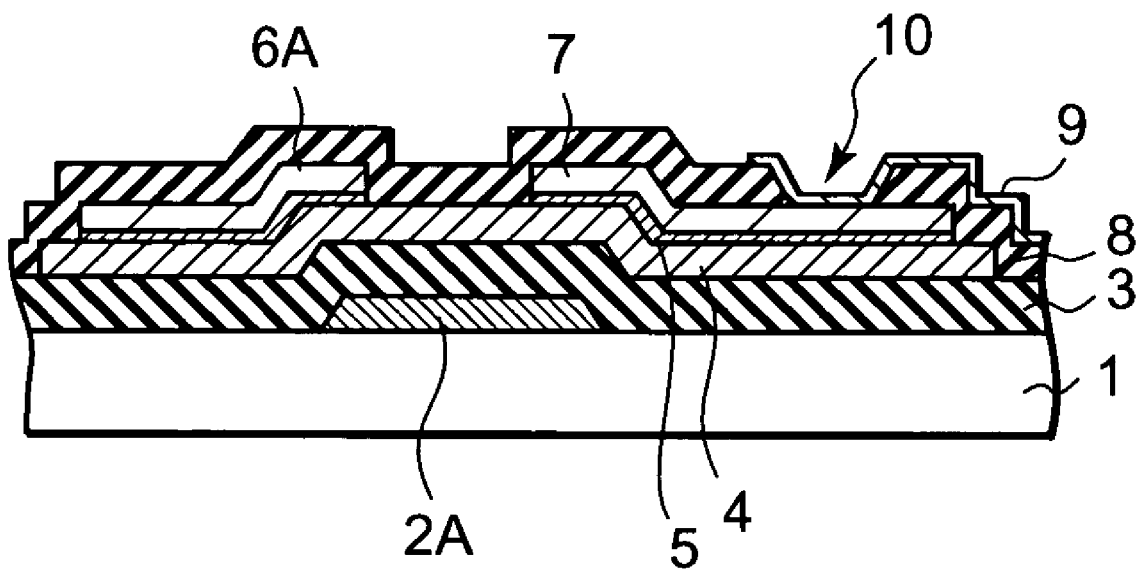
FIG. 14A is a cross-sectional view taken along the line III-III in FIG. 13.
Figure 14B:
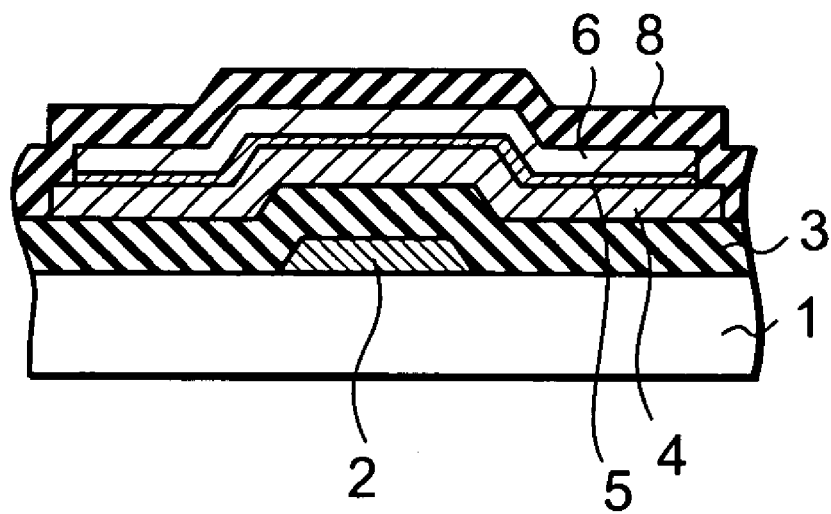
FIG. 14B is a cross-sectional view taken along the line IV-IV in FIG. 13.
Figure 15A:
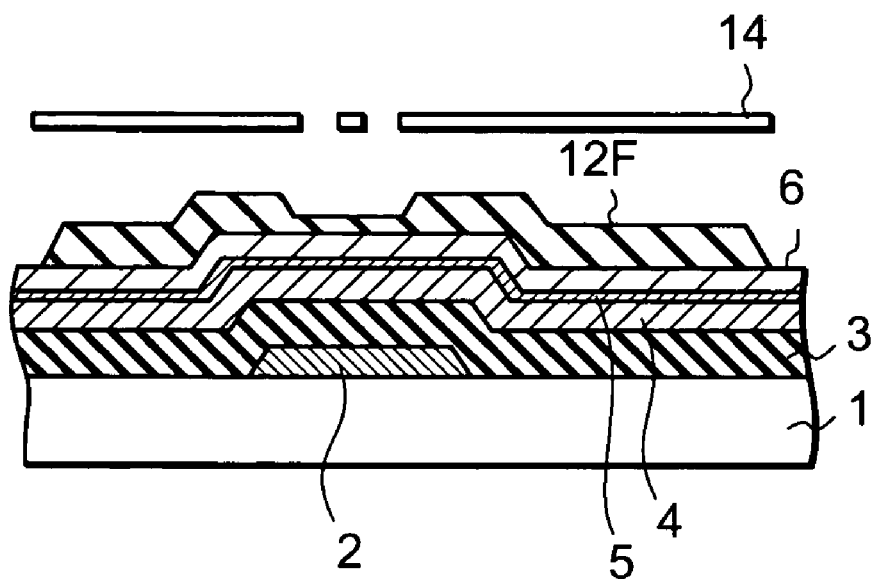
FIG. 15A is a cross-sectional view for schematically illustrating a step of a method of fabricating the TFT substrate of the liquid crystal display unit according to the second embodiment of the present invention.

In the following, an active matrix liquid crystal display unit according to a second embodiment of the present invention will be described with reference to FIGS. 13 to 16. FIG. 13 is a plan view of a TFT substrate of the liquid crystal display unit according to the second embodiment of the present invention showing a configuration thereof near an intersection of gate wiring and drain wiring. FIG. 14A is a cross-sectional view taken along the line III-III in FIG. 13, and FIG. 14B is a cross-sectional view taken along the line IV-IV in FIG. 13. FIGS. 15A to 15E are cross-sectional views for schematically illustrating steps of a method of fabricating the TFT substrate of the liquid crystal display unit according to the second embodiment of the present invention. FIG. 16 is a graph for illustrating an advantage of the second embodiment.

In the case of the liquid crystal display unit according to the first embodiment of the present invention described above, the TFT substrate is fabricated through five lithography steps shown in FIGS. 7A to 7E (that is, the step of patterning the gate electrode and the gate wiring, the step of patterning the semiconductor layer, the step of patterning the drain electrode and the drain wiring, the step of patterning the contact and the step of patterning the pixel electrode). To reduce the price of the liquid crystal display unit, it is preferred to reduce the number of steps. There is no problem if the semiconductor layer remains on the parts other than the intersection of the gate wiring 2 and the drain wiring 6. According to this embodiment, the a-Si sublayer, the drain electrode and the drain wiring are patterned with one resist mask pattern, and the TFT substrate is fabricated in four lithography steps. Here, the opposite substrate of the liquid crystal display unit according to this embodiment is configured the same as that shown in FIG. 4, and description thereof will be omitted.

Now, this embodiment will be described with reference to the drawings.

As shown in FIGS. 13, 14A and 14B, on a transparent insulating substrate 1 of the TFT substrate according to this embodiment, gate wiring 2 has one or more recesses 13 in a predetermined shape formed in at least one side thereof at an area near an intersection with drain wiring 6. The gate wiring 2 and a gate electrode 2A formed on the transparent insulating substrate 1 have the side faces tapered at a predetermined inclination angle. In a TFT area under the drain wiring 6, a drain electrode 6A and a source electrode 7, a semiconductor layer comprising an a-Si sublayer 4 and a n$^+$a-Si sublayer 5 is formed on a gate insulating film 3. The n$^+$a-Si sublayer 5 and the a-Si sublayer 4 in the TFT area are partially removed to form a channel section. At the opposite sides of the channel section, the drain electrode 6A connected to the drain wiring 6 and the source electrode 7 are formed, on which a passivation film 8 for protecting the substrate surface is disposed. Furthermore, the passivation film 8 on the source electrode 7 is partially removed to form a contact section 10, and a pixel electrode 9 made of a transparent conductive film of ITO or the like is formed at each pixel area and the contact section 10.

In this embodiment again, the present invention is not subject to restrictions on the shapes, structures and manufacturing methods of components other than the gate wiring 2, including the gate insulating film 3, the semiconductor layer including the a-Si sublayer 4 and the n+a-Si sublayer 5, the drain wiring 6, the passivation film 8, the pixel electrode 9, the opposite substrate and the liquid crystal. In the case of a forward-staggered TFT in which the semiconductor layer is interposed between the upper gate wiring and the lower drain wiring, the structure of the gate wiring 2 of the inverted-staggered TFT described above is applied to the drain wiring.

A method of fabricating the TFT substrate of the liquid crystal display unit according to this embodiment will be described with reference to FIGS. 15A to 15E. First, as in the first embodiment described above, on the transparent insulating substrate 1 made of glass or the like, by sputtering, for example, Al or an Al alloy is deposited to about 200 nm, and then Mo or a Mo alloy is deposited to about 100 nm. A first resist pattern 12A is formed on the deposited metal film using a known lithography technique. Using the first resist pattern 12A as a mask, the metal film is wet-etched by an etchant, such a mixed acid of phosphoric acid, nitric acid and acetic acid. One or more recesses 13 extending along the drain wiring 6 and having a depth equal to or greater than the width of the drain wiring 6 are formed in at least one side of the gate wiring 2 at an area near the expected intersection with the drain wiring 6. The gate wiring 2 and the gate electrode 2A have the side faces tapered at an inclination angle from 30 degrees to 80 degrees, preferably from 40 degrees to 50 degrees.

Then, the semiconductor layer and the drain wiring 6 are formed. According to this embodiment, the semiconductor layer and the drain wiring 6 are formed using one resist patter in the following procedure. Specifically, as shown in FIG. 15A, the gate insulating film 3 made of silicon nitride is deposited to about 500 nm by plasma CVD or the like. On the gate insulating film 3, the a-Si sublayer 4 and the n+a-Si sublayer 5, which constitute a semiconductor layer of the TFT 11, are successively deposited to about 300 nm and to about 50 nm, respectively, and then, Cr is deposited to about 200 nm by sputtering. Then, a resist pattern 12F is formed on the Cr film. In this embodiment, a photomask (reticle) 14 that has a light-shielding area having a width equal to or smaller than the limit of resolution over the channel section is used, thereby making the resist pattern 12F in the channel section thinner than the other areas. Instead of the photomask 14, a photomask having a translucent area over the channel section may be used.

Figure 15B:
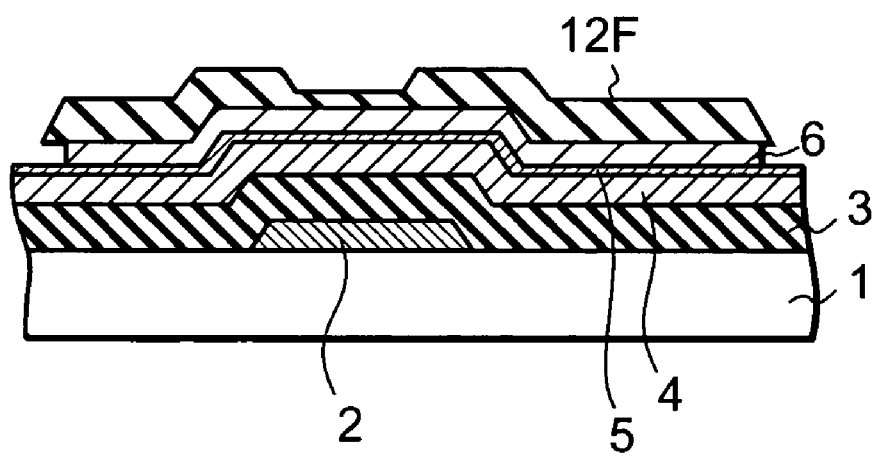
FIG. 15B is a cross-sectional view for schematically illustrating a step of the method of fabricating the TFT substrate of the liquid crystal display unit according to the second embodiment of the present invention.
Figure 16:
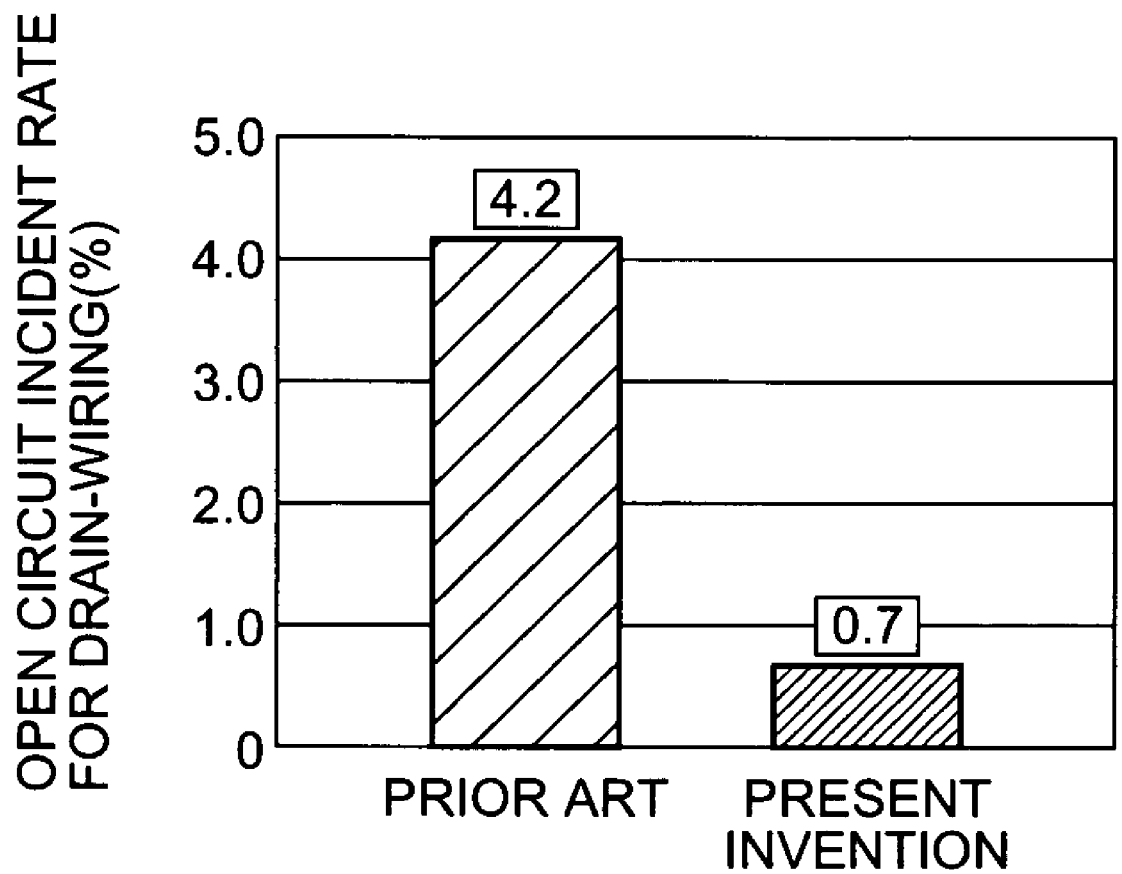
FIG. 16 is a graph for illustrating an advantage of the TFT substrate according to the second embodiment of the present invention.

Then, as shown in FIG. 15B, using the resist pattern 12F as a mask, the drain wiring 6, the drain electrode 6A and the source electrode 7 are formed by wet etching using cerium ammonium nitrate or the like as an etchant. In this embodiment again, since the side faces of the gate wiring are tapered, the drain wiring, the drain electrode and the source electrode have less steep side faces. Thus, deterioration in quality and reduction in thickness of the drain wiring 6 are suppressed, and penetration of the etchant beneath the drain wiring 6 is also suppressed. In addition, since the gate wiring 2 has one or more recesses 13 in a predetermined shape, a sufficiently long path for the etchant penetrating beneath the drain wiring 6 is provided, and etchant penetration at a bend of the step can be suppressed. Thus, the drain wiring can be advantageously prevented from being broken.

Figure 15C:
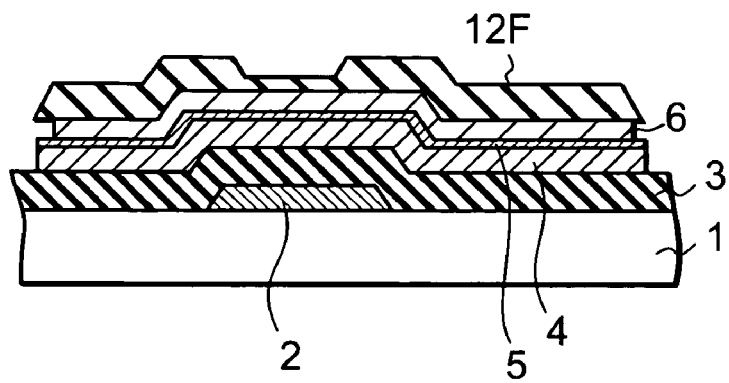
FIG. 15C is a cross-sectional view for schematically illustrating a step of the method of fabricating the TFT substrate of the liquid crystal display unit according to the second embodiment of the present invention.

Then, following the wet etching, as shown in FIG. 15C, the a-Si sublayer 4 and the n+a-Si sublayer 5 are patterned by dry etching to form the semiconductor layer.

Figure 15D:
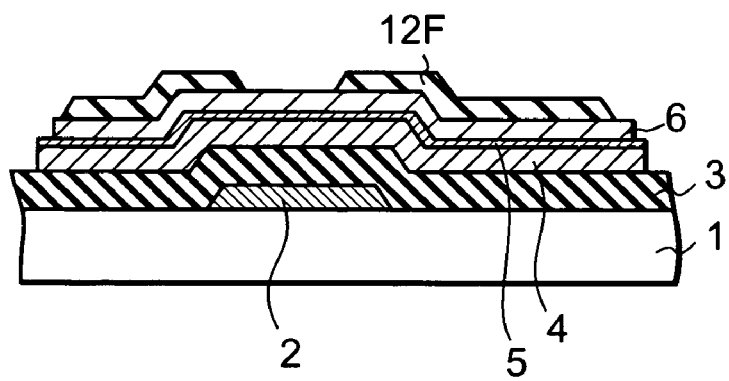
FIG. 15D is a cross-sectional view for schematically illustrating a step of the method of fabricating the TFT substrate of the liquid crystal display unit according to the second embodiment of the present invention.
Figure 15E:
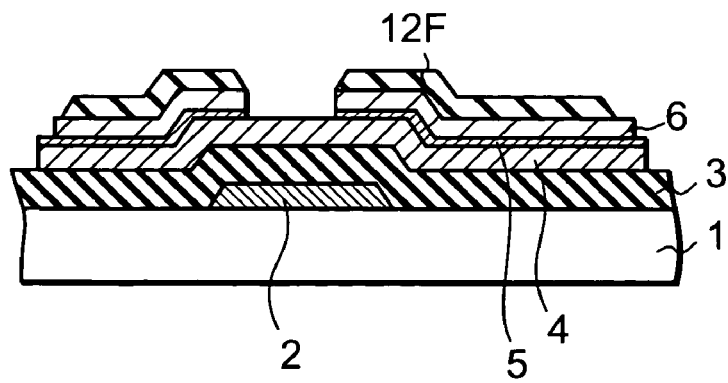
FIG. 15E is a cross-sectional view for schematically illustrating a step of the method of fabricating the TFT substrate of the liquid crystal display unit according to the second embodiment of the present invention.

Then, as shown in FIG. 15D, dry etching, such as oxygen plasma ashing, is performed until the thin resist on the channel is completely removed. Then, Cr on the channel area is etched (in this embodiment, two etchings are performed on Cr), and then as shown in FIG. 15E, the n+a-Si sublayer 5 and the a-Si sublayer 4 are partially removed by dry etching to expose the channel area.

After that, as in the first embodiment, using plasma CVD, for example, the passivation film 8 made of silicon nitride is deposited to about 200 nm, and then, the passivation film 8 is partially removed to form the contact section 10. Then, an ITO film of a thickness of about 50 nm is deposited on the whole surface by sputtering, and the ITO film is patterned to form the pixel electrode 9, which is a transparent electrode. The source electrode 7 and the pixel electrode 9 are connected to each other via the contact section 10.

As described above, in the liquid crystal display unit according to this embodiment again, one or more recesses 13 extending along the drain wiring 6 and having a depth equal to or greater than the width of the drain wiring are formed in at least one side of the gate wiring 2 at an area near expected intersection with the overlying drain wiring 6. The recesses 13 formed on the gate wiring 2 adequately elongate the path for the etchant penetrating beneath the drain wiring 6. Furthermore, since the gate wiring 2 is composed of two layers, the lower one of which is made of Al or an Al alloy, and the upper one of which is made of Mo or a Mo alloy, and the side faces of the gate wiring 2 are tapered at a predetermined inclination angle, deterioration in quality and reduction in thickness of the drain wiring 6 at the step can be suppressed, and a break of the drain wiring can be prevented with reliability.

The rate of occurrence of drain wiring breaks is measured for the TFT substrate according to this embodiment and the TFT substrate fabricated by a conventional method (in which the gate wiring 2 is made of Cr; and neither recess nor protrusion is formed at the intersection of the gate wiring 2 and the drain wiring 6), and the result is shown in FIG. 16. As can be seen from FIG. 16, the rate of occurrence of drain wiring breaks for the conventional TFT substrate is 4.2% (2 defective panels per 48 panels), while the rate of occurrence of drain wiring breaks for the TFT substrate according to the present invention is 0.7% (1 defective panels per 150 panels). From this result, it is confirmed that the TFT substrate according to the present invention is effective for suppressing break of the drain wiring.

While the embodiments have been described in connection with the liquid crystal display unit having the inverted-staggered, channel-etched TFT, the present invention is not limited to those embodiments and can be applied to a channel-protected liquid crystal display unit or a liquid crystal display-unit having a forward-staggered TFT. Furthermore, while the embodiments have been described in connection with the active matrix liquid crystal display unit in which the color filters are formed on the opposite substrate, the present invention is not limited to those embodiments and can be applied to a CFonTFT structure in which color filters are formed on the TFT substrate.

While the present invention has been described in connection with certain preferred embodiments, it is to be understood that the subject matter encompassed by way of the present invention is not to be limited to those specific embodiments. On the contrary, it is intended for the subject matter of the invention to include all alternative, modification and equivalents as can be included within the spirit and scope of the following claims.

What is claimed is:

1. A liquid crystal display unit having a TFT substrate, the TFT substrate comprising:
    a transparent insulating substrate;
    a first wiring disposed on said transparent insulating substrate, said first wiring having a major first portion and a second portion;
    a second wiring disposed over said first wiring, said second wiring intersecting said first wiring; and
    a thin film transistor being formed in each area surrounded by said first wiring and said second wiring, wherein plural recesses extending along said second wiring are formed in at least one same side of said second portion of said first wiring at an area near an intersection with said second wiring, so that said second portion has a width less than said first portion,
    wherein adjacent sides of said plural recesses extending along said second wiring lie within an area directly below said second wiring, and
    wherein said plural recesses of said first wiring overlap respective sides of said second wiring.

2. The liquid crystal display unit according to claim 1, wherein said recesses have a depth equal to or greater than the width of said second wiring.

3. The liquid crystal display unit according to claim 1, wherein two or more sides of said recesses lie within the area directly below said second wiring.

4. The liquid crystal display unit according to claim 1, wherein two said recesses are formed, and adjacent sides of two said recesses extending along said second wiring lie within the area directly below said second wiring.

5. The liquid crystal display unit according to claim 1, wherein said first wiring is composed of a stack of plural kinds of metals, and side faces of said first wiring are tapered.

6. The liquid crystal display unit according to claim 5, wherein said metal stack of said first wiring is composed of two layers, the lower one being made of a first material selected from Al and an Al alloy, and the upper one being made of a second material selected from Mo and a Mo alloy.

7. The liquid crystal display unit according to claim 5, wherein the taper angle of the side faces of said first wiring falls between 30 degrees and 80 degrees.

8. The liquid crystal display unit according to claim 1, wherein said first wiring is a gate wiring, and said second wiring is a drain wiring.

9. The liquid crystal display unit according to claim 8, wherein a gate insulating film and a semiconductor layer are formed between said gate wiring and said drain wiring, the gate insulating film being located below the semiconductor layer.

10. The liquid crystal display unit according to claim 9, wherein said semiconductor layer has a lower a-Si sublayer and an upper n$^+$a-Si sublayer.

11. A liquid crystal display unit having a TFT substrate, the TFT substrate comprising:
    a transparent insulating substrate;
    a first wiring disposed on said transparent insulating substrate;
    a second wiring disposed over said first wiring, said second wiring intersecting said first wiring; and
    a thin film transistor being formed in each area surrounded by said first wiring and said second wiring, wherein plural recesses extending along said second wiring are formed in at least one same side of said first wiring at an area near an intersection with said second wiring, and wherein a width of a recessed portion in said first wiring is narrower than that of a majority of said first wiring, wherein adjacent sides of said plural recesses extending along said second wiring lie within an area directly below said second wiring, and
    wherein said plural recesses of said first wiring overlap respective sides of said second wiring.

12. The liquid crystal display unit according to claim 11, wherein said recess extends toward an inner portion in said first wiring along said second wiring.

13. The liquid crystal display unit according to claim 11, wherein said recesses have a depth equal to or greater than the width of said second wiring.

14. The liquid crystal display unit according to claim 11, wherein two or more sides of said recesses lie within the area directly below said second wiring.

15. The liquid crystal display unit according to claim 11, wherein two said recesses are formed, and adjacent sides of two said recesses extending along said second wiring lie within the area directly below said second wiring.

16. The liquid crystal display unit according to claim 11, wherein said first wiring is a gate wiring, and said second wiring is a drain wiring.

17. The liquid crystal display unit according to claim 16, wherein a gate insulating film and a semiconductor layer are formed between said gate wiring and said drain wiring, the gate insulating film being located below the semiconductor layer.

18. The liquid crystal display unit according to claim 17, wherein said semiconductor layer has a lower a-Si sublayer and an upper n$^+$a-Si sublayer.

19. A liquid crystal display unit having a TFT substrate, said TFT substrate comprising:
    an insulating substrate;
    a first wiring disposed on said insulating substrate and having a first width over a majority of a length of said first wiring;
    a second wiring disposed over said first wiring, said second wiring intersecting said first wiring; and
    a thin film transistor at an intersection of said first wiring and said second wiring, plural recesses being formed in at least one same side of said first wiring at said intersection so that said first wiring has a second width less than said first width at said at least one recess, said at least one recess extending along said second wiring, adjacent sides of said plural recesses extending along said second wiring lying within an area directly below said second wiring, and said plural recesses of said first wiring overlapping respective sides of said second wiring.

* * * * *